United States Patent [19]

Lur et al.

[11] Patent Number: 5,413,962
[45] Date of Patent: May 9, 1995

[54] MULTI-LEVEL CONDUCTOR PROCESS IN VLSI FABRICATION UTILIZING AN AIR BRIDGE

[75] Inventors: Water Lur, Taipei; Jiunn Y. Wu, Don-Lio, both of Taiwan, Prov. of China

[73] Assignee: United Microelectronics Corporation, Hsinchu, Taiwan, Prov. of China

[21] Appl. No.: 275,268

[22] Filed: Jul. 15, 1994

[51] Int. Cl.⁶ .................................... H01L 21/44
[52] U.S. Cl. ..................... 437/195; 437/927; 148/DIG. 73
[58] Field of Search ............... 148/DIG. 73; 437/927, 437/64, 65, 195; 257/522

[56] References Cited

U.S. PATENT DOCUMENTS

| | | | |
|---|---|---|---|
| 4,169,000 | 9/1979 | Riseman | 148/187 |
| 4,710,794 | 12/1987 | Koshino et al. | 357/49 |
| 4,754,316 | 6/1988 | Reid | |
| 5,000,818 | 3/1991 | Thomas et al. | 437/195 |
| 5,216,537 | 6/1993 | Hornbeck | 359/291 |
| 5,227,658 | 7/1993 | Beyer et al. | 257/522 |
| 5,310,700 | 5/1994 | Lien et al. | 437/195 |
| 5,324,683 | 6/1994 | Fitch et al. | 148/DIG. 73 |

FOREIGN PATENT DOCUMENTS

| | | | |
|---|---|---|---|
| 62-299051 | 12/1987 | Japan | |
| 4-320049 | 11/1992 | Japan | 437/195 |
| 5-21617 | 1/1993 | Japan | 437/195 |

*Primary Examiner*—Brian E. Hearn
*Assistant Examiner*—Leon Radomsky
*Attorney, Agent, or Firm*—George O. Saile

[57] ABSTRACT

This invention deals with the formation of the multi-level electrode metal structure and the interconnecting inter-level metal studs used in the fabrication of VLSI circuits. After the metal layers have been formed the inter-level dielectric material used in forming the structure is etched away leaving an air dielectric between the levels. The electrode metal and the inter-level metal studs are coated with a thin envelope oxide and the entire structure is covered with a passivation layer using material with a poor step coverage. The structure of this invention provides reduced parasitic capacitance, better step coverage in interconnecting layers, and improved circuit performance.

12 Claims, 7 Drawing Sheets

MULTI-LEVEL CONDUCTOR PROCESS IN VLSI FABRICATION UTILIZING AN AIR BRIDGE

BACKGROUND OF THE INVENTION

1. FIELD OF THE INVENTION

The invention relates to an improved multi-level conductor electrode structure for VLSI circuits and to the method of forming the improved structure. The multi-level conductor electrode structure is formed using an air dielectric between the conductor electrode levels. The conductor electrodes and the interconnecting inter-level metal studs are coated with a thin envelope oxide. The entire structure is covered with a passivation layer having poor step coverage.

2. DESCRIPTION OF THE RELATED ART

The conventional fabrication of multi-level conductor electrode metal structures uses levels of conductor electrode metal and inter-metal dielectric stacked layer by layer until the desired number of conductor levels are formed. In this invention the inter-level dielectric is replaced by air dielectric thereby reducing parasitic capacitance and improving circuit performance. This invention uses a thin envelope oxide coating on all metal electrodes and inter-metal studs.

There are other patents dealing with air gap isolation. U.S. Pat. No. 5,216,537 to Hornbeck shows a method for making air gap isolation in circuit metalization. U.S. Pat. No. 4,169,000 to Riseman, U.S. Pat. No. 4,710,794 to Koshino et al, and U.S. Pat. No. 5,227,658 to Beyer et al show methods for making air gap isolation between segments of the integrated circuit.

SUMMARY OF THE INVENTION

It is a principle objective of this invention to provide a multi-level metal electrode structure for Very Large Scale Integration or VLSI circuits where the metal electrodes are separated by an air dielectric. The air dielectric reduces inter electrode parasitic capacitance and relieves the stress in the multilayer metal electrode structure. Device reliability and performance are improved.

It is also a principle objective of this invention to provide a method of forming a multilevel metal electrode structure for VLSI circuits where the metal electrodes are separated by an air dielectric.

In the fabrication of VLSI circuits multi-level metal electrodes and inter-metal dielectric are stacked layer by layer. This results in large parasitic capacitance between electrodes which degrades circuit performance. In addition large stress levels are present in the structure adversely affecting device reliability. In this invention the inter-metal dielectric material is removed after the structure is formed leaving air, with a reduced dielectric constant, as the inter-metal dielectric. The electrode metals and inter-level via studs are protected by a thin oxide envelope which forms a coating on the metals. Further protection is provided by a passivation layer over top of the metal structure after the inter-level dielectric material is removed.

The reduced dielectric constant reduces inter electrode parasitic capacitance and improves circuit performance. Removing the inter-metal dielectric material also relieves the stress in the structure which improves device reliability. In addition the aspect ratio of the metal vias can be reduced making metal deposition easier.

DESCRIPTION OF THE PREFERRED EMBODIMENTS

Figure 1:
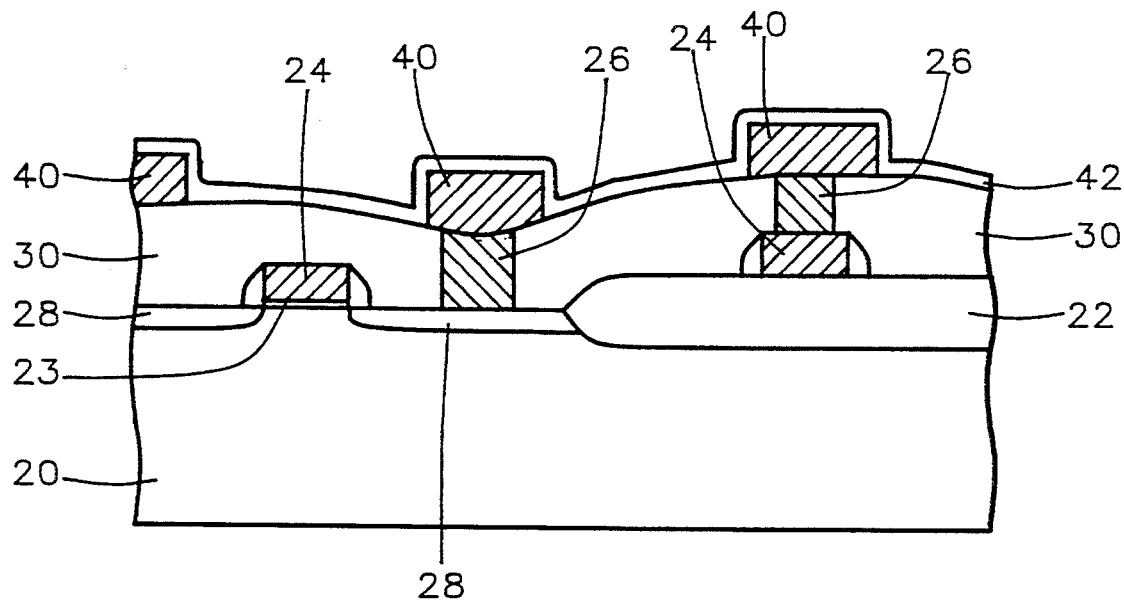
FIG. 1 is a cross sectional representation of the VLSI circuit showing the base dielectric layer, the first electrode pattern formed in the first metal layer, and first thin oxide envelope layer.

Refer now to FIG. 1 through FIG. 11, there is shown an embodiment of a method of forming a multi-level conductor electrode structure with an air dielectric for VLSI circuits. FIG. 1 shows a cross sectional representation of a silicon VLSI circuit substrate 20 with doped source/drain regions 28, gate dielectric 23, polysilicon conductors 24, a field oxide isolation region 22, contact studs 26 between the VLSI circuits and the first electrode metal layer, and a base dielectric layer 30 of a material such as borophosphosilicate glass. A patterned first electrode metal layer 40 is formed on the base dielectric layer using a metal such as aluminum, aluminum alloy, tungsten, copper, or silver deposited using physical vapor deposition or chemical vapor deposition methods and patterned using standard lithographic techniques. The contact studs 26 and the first electrode metal layer 40 can be formed in one deposition step or sequentially. A first thin envelope oxide layer 42 of $SiO_2$ with a thickness of between about 1000 and 2000 Angstroms is formed over the substrate surface. The first thin envelope oxide layer is formed using a chemical vapor deposition with precursor of tetraethoxysilane, or $SiH_4$ and $O_2$ or $O_3$. Hereafter tetraethoxysilane will be referred to as TEOS.

Figure 2:
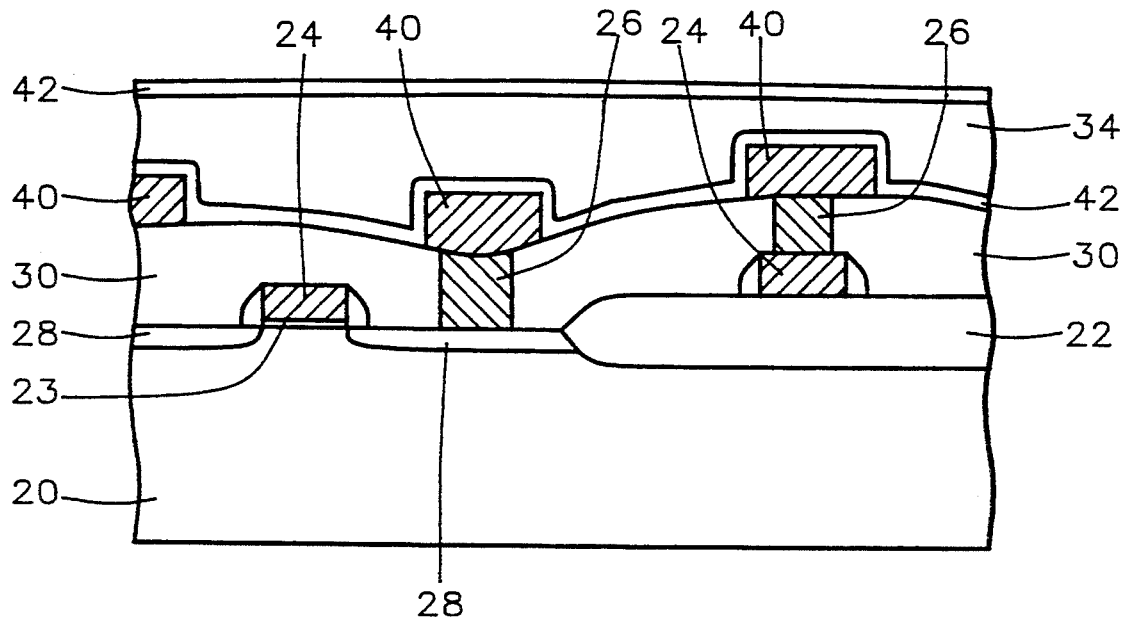
FIG. 2 is a cross sectional representation of the VLSI circuit showing the first layer of inter-metal dielectric and second thin envelope oxide layer.
Figure 3:
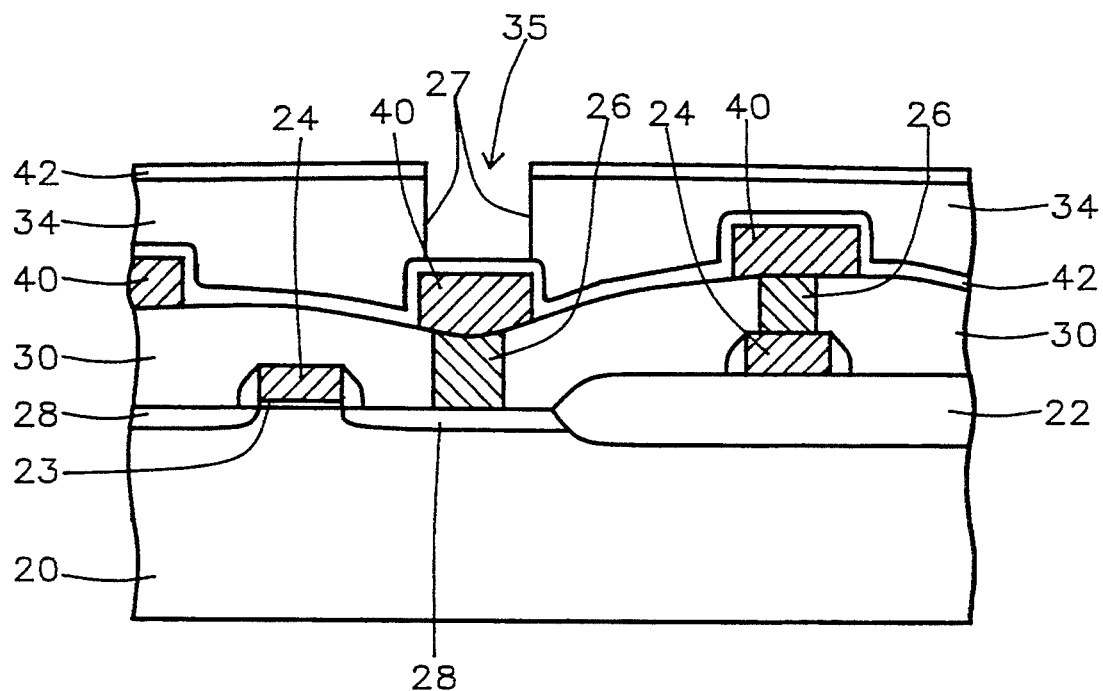
FIG. 3 is a cross sectional representation of the VLSI circuit showing the first inter-level vias.
Figure 4:
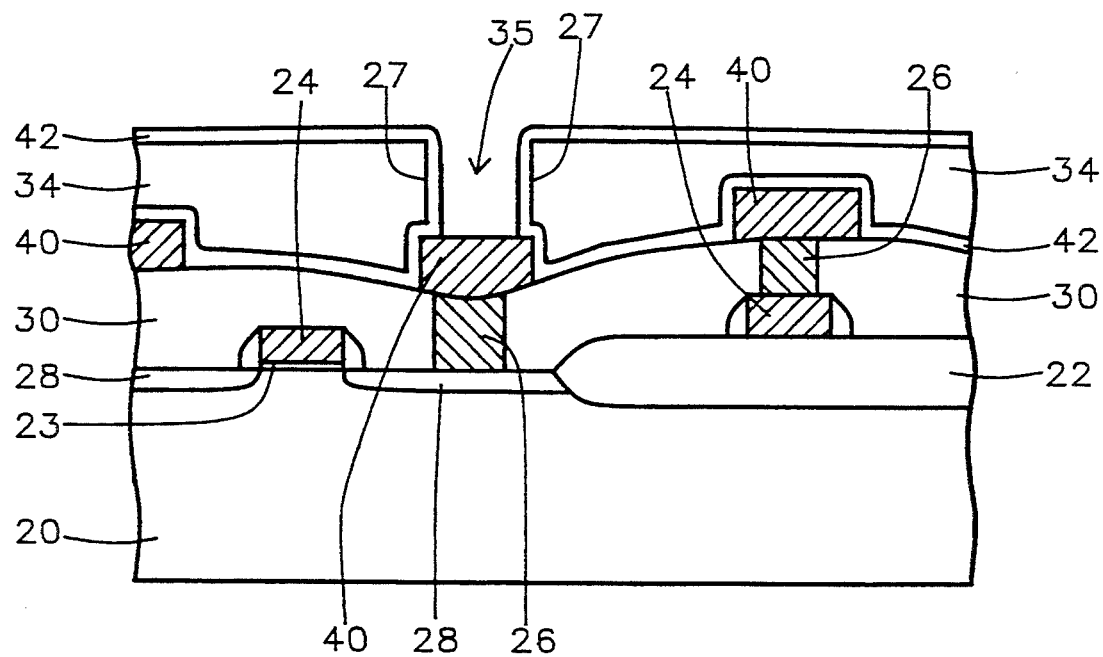
FIG. 4 is a cross sectional representation of the VLSI circuit showing the thin envelope oxide spacer formed on the sidewalls of the first inter-level vias.

Next, as shown in FIG. 2, a first layer of inter-metal dielectric 34 is deposited over the surface of the substrate. The inter-metal dielectric is $Si_3N_4$ deposited using chemical vapor deposition with a thickness of between about 1000 Angstroms and 8000 Angstroms. Next a second layer of thin envelope oxide 42 is deposited on the first layer of inter-metal dielectric. The second layer of thin envelope oxide, like the first layer, is $SiO_2$ with a thickness of between about 1000 and 2000 Angstroms formed using chemical vapor deposition with TEOS or $SiH_4$ and $O_2$ or $O_3$. Next, as shown in FIG. 3, inter-level vias 35 with sidewalls 27 are etched through the first and second thin envelope oxide layers and the first inter-metal dielectric layer using $SF_6$, He, $CHF_3$, $O_2$ or the like. Next, as shown in FIG. 4, a thin envelope oxide spacer of $SiO_2$ with a thickness of between about 1000 and 2000 Angstroms is formed on the sidewalls 27 of the inter-level vias 35. The thin envelope oxide spacers are formed by a chemical vapor deposition with TEOS or $SiH_4$ and $O_2$ or $O_3$ over the surface of the substrate followed by vertical anisotropic etching of the $SiO_2$ using $CHF_3$, $O_2$, Ar or the like.

Figure 5:
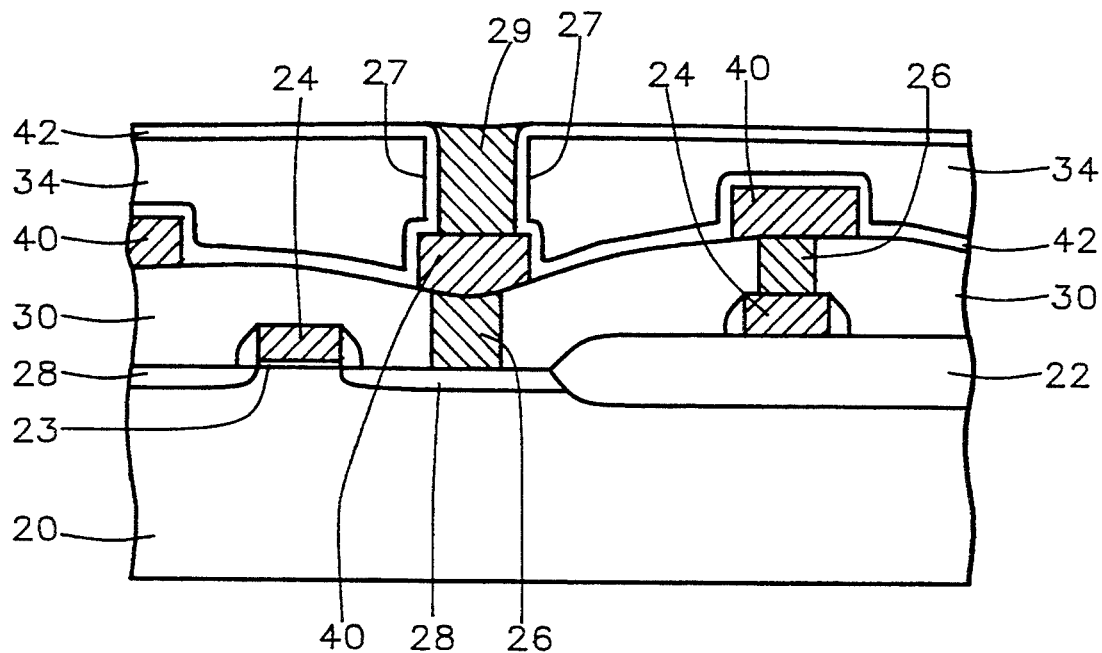
FIG. 5 is a cross sectional representation of the VLSI circuit showing the first inter-level vias filled with the first inter-level metal studs.
Figure 6:
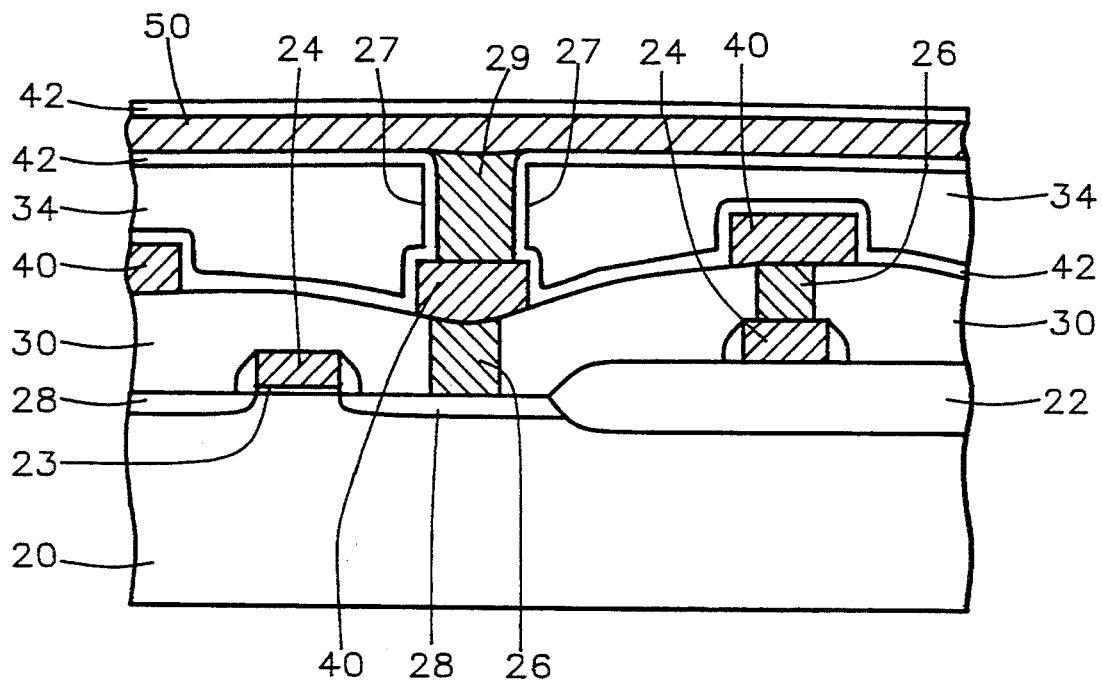
FIG. 6 is a cross sectional representation of the VLSI circuit showing the second electrode metal layer and the third thin envelope oxide layer.

As shown in FIG. 5 the inter-level vias are then filled with inter-level metal studs 29 using metals such as aluminum, aluminum alloy, tungsten, copper, or silver; deposited using physical vapor deposition or chemical vapor deposition methods and patterned using standard lithographic techniques. Next, as shown in FIG. 6, a second metal electrode layer 50 is formed over the surface of the substrate using a metal such as aluminum, aluminum alloy, tungsten, copper, or silver deposited using physical vapor deposition or chemical vapor deposition methods with a thickness of between about 4000 and 10,000 Angstroms. The inter-level metal studs 29 and the second metal electrode layer 50 can be formed in one deposition step or sequentially. Next a third thin envelope oxide layer 42 of $SiO_2$ with a thickness of between about 1000 and 2000 Angstroms is formed on the surface of the second electrode metal layer using the same method as used for the first and second layers of thin envelope oxide.

Figure 7:
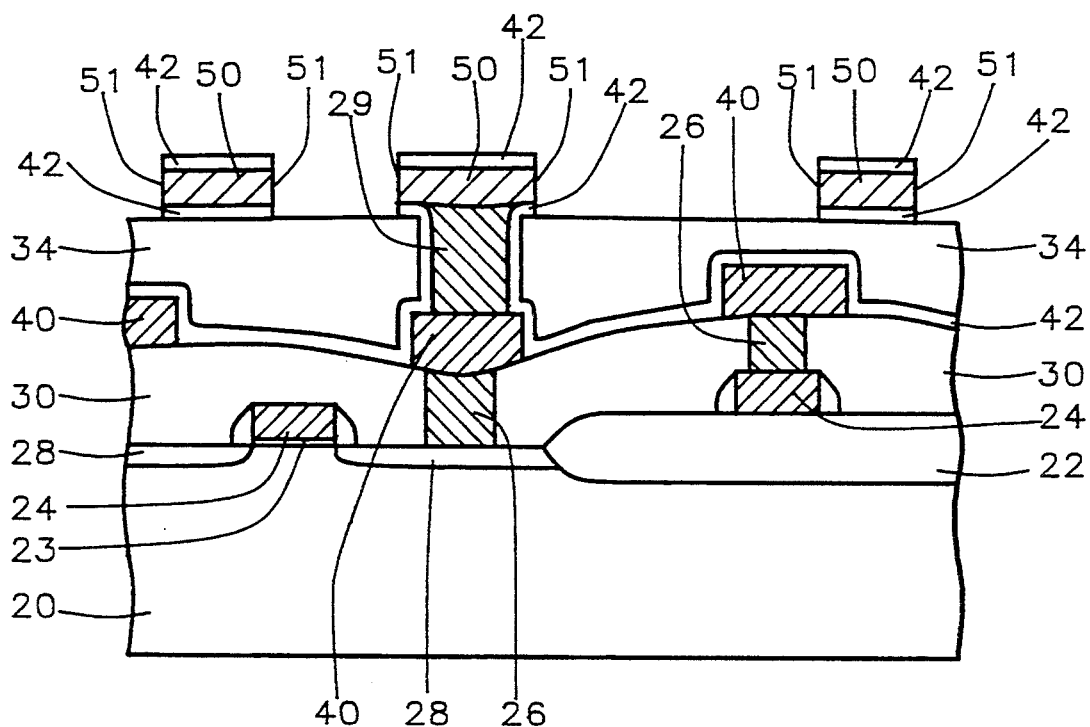
FIG. 7 is a cross sectional representation of the VLSI circuit showing the second electrode pattern formed in the second electrode metal layer, the second thin envelope oxide layer and the third thin envelope oxide layer.
Figure 8:
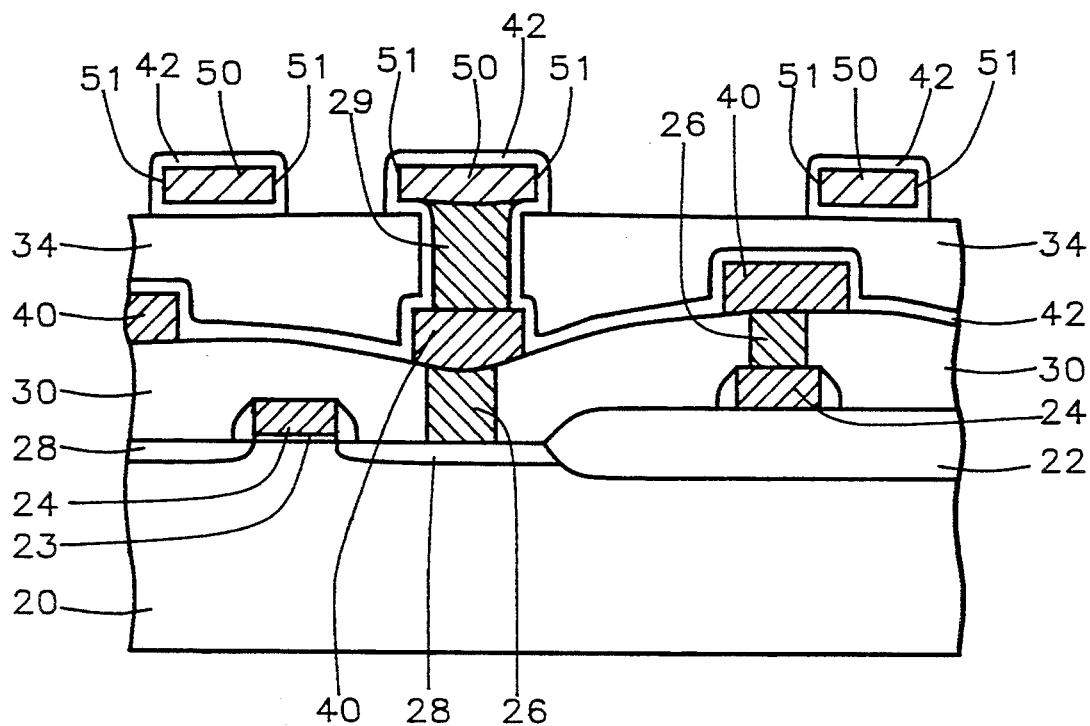
FIG. 8 is a cross sectional representation of the VLSI circuit showing the thin envelope oxide spacers formed on the sidewalls of the second electrode pattern.

As shown in FIG. 7, the second electrode pattern 50 having sidewalls 51 is formed in the second electrode metal layer and the second and third thin envelope oxide layers using standard lithographic techniques; etching $SiO_2$ with $CHF_3$, $O_2$, Ar or the like, and etching Al with $Cl_2$, $CF_4$, $N_2$ or the like. As shown in FIG. 8, a thin envelope oxide spacer layer is then formed on the sidewalls 51 of the second electrode pattern using chemical vapor deposition with TEOS or $SiH_4$ and $O_2$ or $O_3$ over the surface of the substrate followed by vertical anisotropic etching of the $SiO_2$ with $CHF_3$, $O_2$, Ar or the like.

Figure 9:
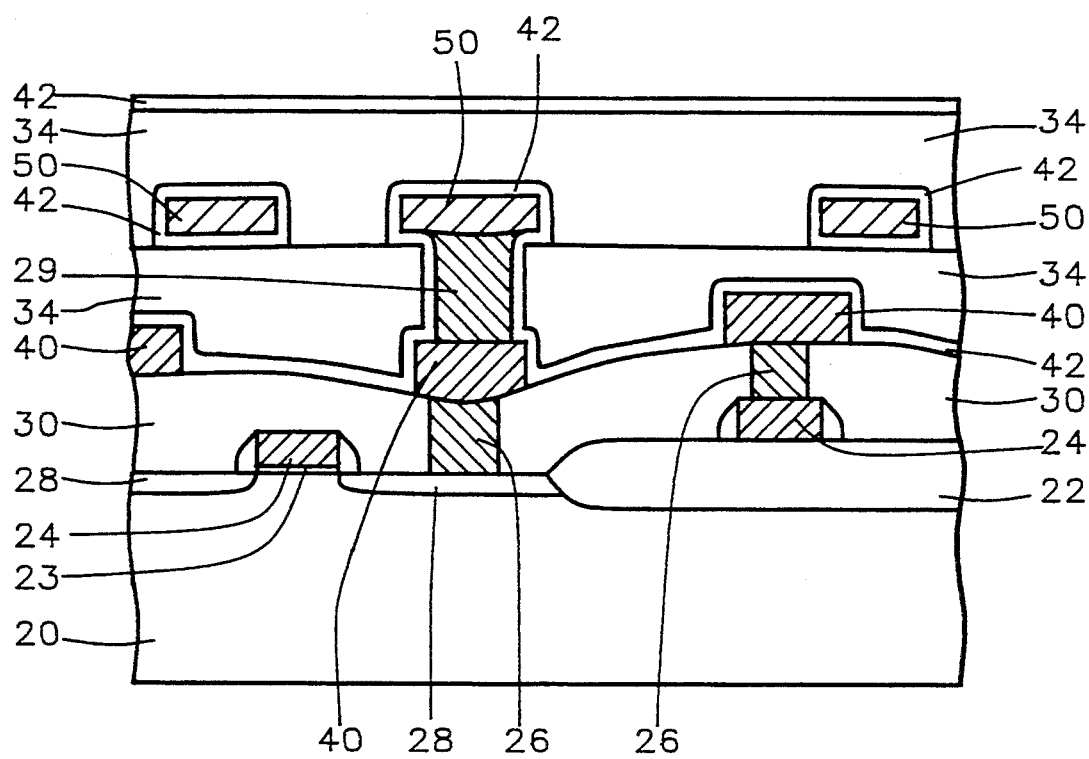
FIG. 9 is a cross sectional representation of the VLSI circuit showing the second layer of inter-metal dielectric and fourth thin envelope oxide layer.

Next additional patterned electrode metal layers and inter-metal dielectric layers are added as desired using the same process steps used to add the second electrode metal layer to the first electrode metal layer. FIG. 9 shows a second inter-metal dielectric layer 34 and a fourth thin envelope oxide layer 42 formed in preparation for the third electrode metal layer.

Figure 10:
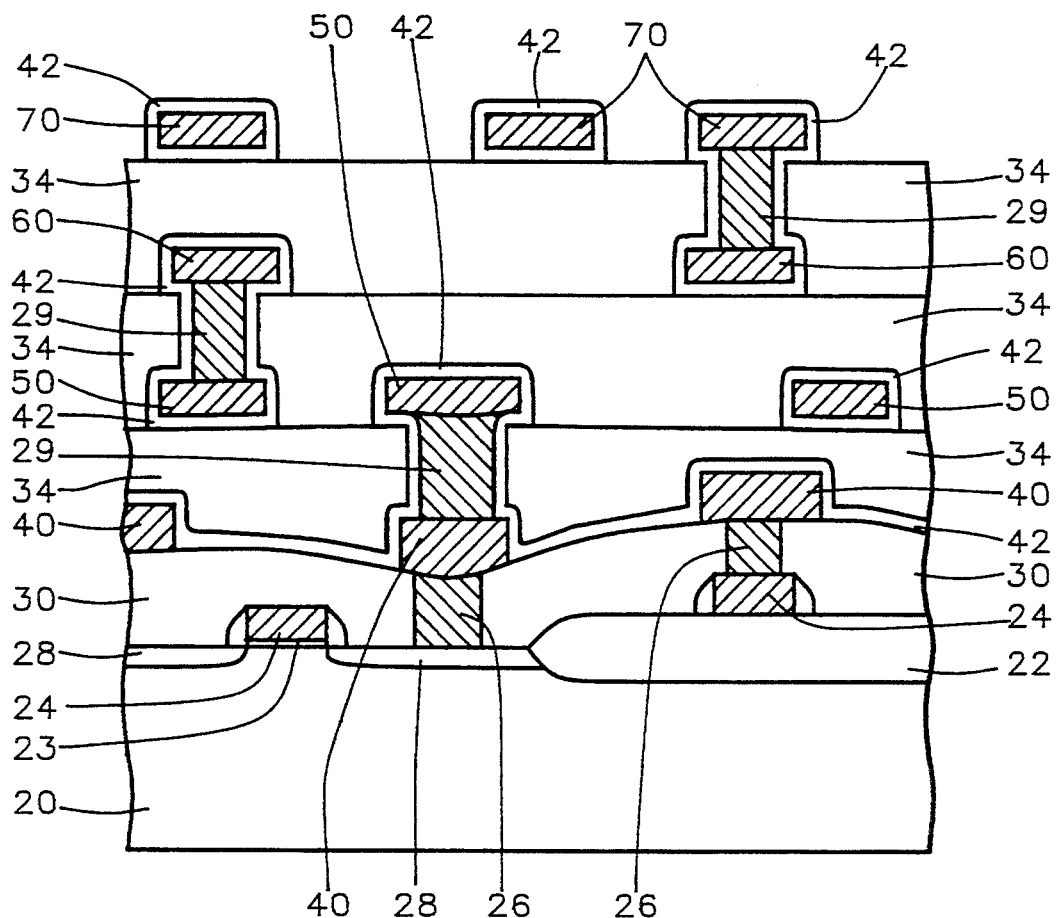
FIG. 10 is a cross sectional representation of the VLSI circuit showing four patterned layers of electrode metal and three layers of inter-metal dielectric.
Figure 11:
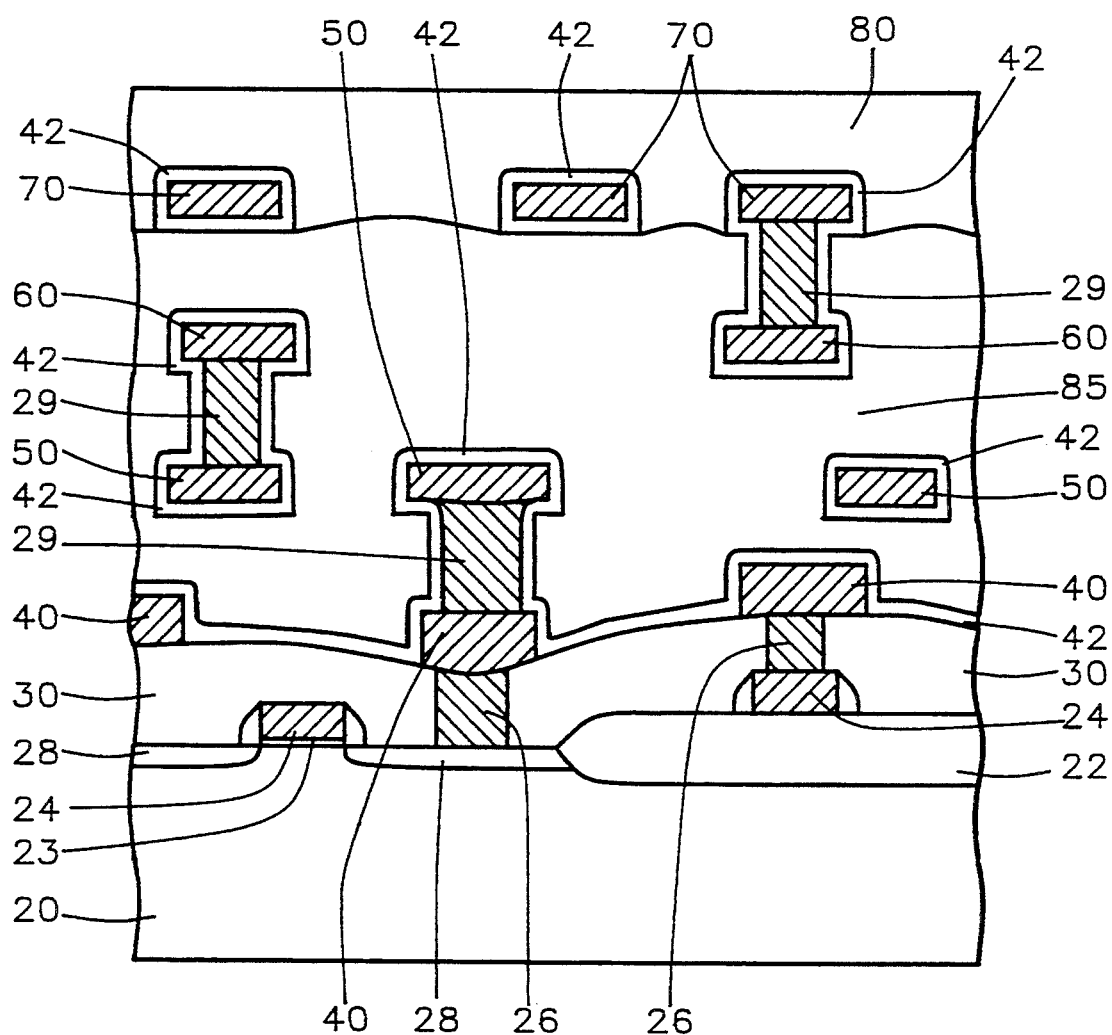
FIG. 11 is a cross sectional representation of the VLSI circuit showing four patterned layers of electrode metal separated by an air dielectric and a passivation layer over the structure.

FIG. 10 shows the VLSI circuit substrate with four electrode metal layers; 40, 50, 60, and 70; and three inter-metal dielectric layers 34. Thin envelope oxide 42 surrounds all the electrode metal and inter-level metal studs 29. Next, as shown in FIG. 11, the inter-level dielectric is etched away leaving an air dielectric 85 between the electrode metal layers. The inter-level dielectric is etched using a solution with a high etch selectivity for nitride to oxide such as phosphoric acid. The surface of all electrode pattern metal and inter-level stud metal is covered with a coating of thin envelope oxide. The entire structure is then covered with a passivation layer 80 as shown in FIG. 11. The passivation layer is an oxide, such as $SiO_2$; a nitride, such as $Si_3N_4$; or a polyimide and is deposited using chemical vapor deposition or physical vapor deposition such that it has poor step coverage.

Refer again to FIG. 11, there is shown an embodiment of the multi-level conductor electrode structure with an air dielectric for VLSI circuits. FIG. 11 shows a cross sectional representation of a silicon VLSI circuit substrate 20 with doped source/drain regions 28, polysilicon conductors 24, gate dielectric 23, a field oxide isolation region 22, contact studs 26 between the VLSI circuit and the first electrode metal layer, and a base dielectric layer 30 of a material such as borophosphosilicate glass. A patterned first electrode metal layer 40 is formed on the base dielectric layer using a metal such as aluminum, aluminum alloy, tungsten, copper, or silver. Additional electrode metal layers 50, 60 and 70 are formed as desired, four such layers are shown in FIG. 11, and interconnected by inter-level metal studs 29. The inter-level metal studs 29 are formed of metals such as aluminum, aluminum alloy, tungsten, copper, or silver. The electrode metal and inter-level metal studs are coated with a thin envelope oxide layer 42 of $SiO_2$ with a thickness of between about 1000 and 2000 Angstroms. The entire structure is covered with a passivation layer 80 of an oxide, such as $SiO_2$; a nitride, such as $Si_3N_4$; or a polyimide having a poor step coverage. The electrode metal layers are separated by an air dielectric 85 which reduces parasitic capacitance and improves circuit performance. System stresses are reduced using the air dielectric which improves device reliability.

While the invention has been particularly shown and described with reference to the preferred embodiments thereof, it will be understood by those skilled in the art that various changes in form and details may be made without departing from the spirit and scope of the invention.

What is claimed is:

1. A method of forming a multi-level conductor structure for VLSI circuits, comprising the steps of:

providing a silicon substrate with circuits formed therein, a base dielectric layer formed on said substrate, and contact studs formed in said base dielectric layer making electrical contact with said circuits;

forming a first electrode metal layer on said base dielectric layer and contact studs;

etching a first electrode pattern in said first electrode metal layer;

forming a first thin envelope oxide layer on said first electrode pattern and said base dielectric layer;

forming a first inter-metal dielectric layer over said thin envelope oxide layer;

forming a second thin envelope oxide layer over said first inter-metal dielectric layer;

etching first inter-level vias with sidewalls in said first inter-metal dielectric layer, said first thin envelope oxide layer, and said second thin envelope oxide layer;

forming a thin envelope oxide spacer on said sidewalls of said first inter-level vias;

filling said first inter-level vias with first inter-level metal studs;

forming a second electrode metal layer on said second thin envelope oxide layer and said first inter-level metal studs;

forming a third thin envelope oxide layer on said second electrode metal layer;

etching a second electrode pattern in said second electrode metal layer, said second envelope oxide layer, and said third envelope oxide layer said second electrode pattern having sidewalls;

forming a thin envelope oxide spacer on said sidewalls of said second electrode pattern;

removing all said inter-metal dielectric; and forming a passivation layer with poor step coverage over said silicon substrate.

2. The method of claim 1, further comprising; after forming said thin envelope oxide spacer on said sidewalls of said second electrode pattern, before removing all said inter-metal dielectric, and before forming said passivation layer with poor step coverage; the steps of:

forming a second layer of inter-metal dielectric over said second electrode pattern in said second electrode metal layer;

forming a fourth thin envelope oxide layer over said second inter-metal dielectric layer;

etching second inter-level vias with sidewalls in said second layer of inter-metal dielectric, said third thin envelope oxide layer, and said fourth thin envelope oxide layer;

forming a thin envelope oxide spacer on said sidewalls of said second inter-level vias;

filling said second inter-level vias with second inter-level metal studs;

forming a third electrode metal layer on said fourth thin envelope oxide layer and said second inter-level metal studs;

forming a fifth thin envelope oxide layer on said third electrode metal layer;

etching a third electrode pattern in said third electrode metal layer, said fourth envelope oxide layer, and said fifth envelope oxide layer said pattern having sidewalls; and forming a thin envelope oxide spacer on said sidewalls of said third electrode pattern.

3. The method of claim 2, further comprising; after forming said thin envelope oxide spacer on said sidewalls of said third electrode pattern, before removing all said inter-metal dielectric, and before forming said passivation layer with poor step coverage; the steps of:

forming a third layer of inter-metal dielectric over said third electrode pattern in said third electrode metal layer;

forming a sixth thin envelope oxide layer over said third inter-metal dielectric layer;

etching third inter-level vias with sidewalls in said third layer of inter-metal dielectric, said fifth thin envelope oxide layer, and said sixth thin envelope oxide layer;

forming a thin envelope oxide spacer on said sidewalls of said third inter-level vias;

filling said third inter-level vias with third inter-level metal studs;

forming a fourth electrode metal layer on said sixth thin envelope oxide layer and said third inter-level metal studs;

forming a seventh thin envelope oxide layer on said fourth electrode metal layer;

etching a fourth electrode pattern in said fourth electrode metal layer, said sixth envelope oxide layer, and said seventh envelope oxide layer said pattern having sidewalls; and forming a thin envelope oxide spacer on said sidewalls of said fourth electrode pattern.

4. The method of claim 1 wherein said thin envelope oxide layers are $SiO_2$ with a thickness of between about 1000 and 2000 Angstroms and are formed using chemical vapor deposition with tetraethoxysilane (TEOS) or $SiH_4$ and $O_2$ or $O_3$ as precursors.

5. The method of claim 1 wherein said thin envelope oxide spacers are formed by depositing a layer of $SiO_2$ with a thickness of between about 1000 and 2000 Angstroms using chemical vapor deposition with tetraethoxysilane (TEOS) or $SiH_4$ and $O_2$ or $O_3$ as precursors and vertically anisotropically etching said layer of $SiO_2$ using $CHF_3$, $O_2$, Ar or the like.

6. The method of claim 1 wherein said inter-metal dielectric is $Si_3N_4$ deposited using chemical vapor deposition.

7. The method of claim 6 wherein said inter-metal dielectric is removed by etching in a solution with a high etch selectivity for nitride to oxide.

8. The method of claim 7 wherein said solution with a high etch selectivity for nitride to oxide is phosphoric acid.

9. The method of claim 1 wherein said electrode metal is aluminum, an alloy of aluminum, tungsten, copper, or silver.

10. The method of claim 1 wherein said inter-level metal studs are aluminum, an alloy of aluminum, tungsten, copper, or silver.

11. The method of claim 1 wherein said base dielectric layer is borophosphosilicate glass.

12. The method of claim 1 wherein said passivation layer with poor step coverage is $SiO_2$, $Si_3N_4$, or polyimide.

* * * * *